(12) United States Patent
Nakamura

(10) Patent No.: US 9,379,016 B2
(45) Date of Patent: Jun. 28, 2016

(54) WAFER PROCESSING METHOD

(71) Applicant: DISCO CORPORATION, Tokyo (JP)

(72) Inventor: Masaru Nakamura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 60 days.

(21) Appl. No.: 14/257,601

(22) Filed: Apr. 21, 2014

(65) Prior Publication Data

US 2014/0315372 A1    Oct. 23, 2014

(30) Foreign Application Priority Data

Apr. 22, 2013    (JP) .................................. 2013-089579

(51) Int. Cl.
*H01L 21/78*    (2006.01)
*H01L 21/683*    (2006.01)

(52) U.S. Cl.
CPC ............ *H01L 21/78* (2013.01); *H01L 21/6836* (2013.01)

(58) Field of Classification Search
CPC . H01L 21/68721; H01L 21/82; H01L 21/822; H01L 21/673
USPC ......................................................... 438/463
See application file for complete search history.

(56) References Cited

U.S. PATENT DOCUMENTS

| 2004/0002199 | A1* | 1/2004 | Fukuyo et al. ................. 438/460 |
| 2005/0215033 | A1* | 9/2005 | Yamamoto et al. ........... 438/464 |
| 2006/0014320 | A1* | 1/2006 | Yamano et al. ............... 438/113 |
| 2006/0154066 | A1* | 7/2006 | Kita et al. ...................... 428/401 |
| 2008/0217311 | A1* | 9/2008 | Eberhardt ............. C03B 33/091 219/121.72 |
| 2011/0237050 | A1* | 9/2011 | Sugimura et al. ............. 438/465 |
| 2014/0295646 | A1* | 10/2014 | Shinoda et al. ............... 438/464 |

FOREIGN PATENT DOCUMENTS

| JP | 2002-192370 | 7/2002 |
| JP | 2006-054246 | 2/2006 |
| JP | 2012-084618 | 4/2012 |

* cited by examiner

*Primary Examiner* — Caridad Everhart
(74) *Attorney, Agent, or Firm* — Greer Burns & Crain, Ltd

(57) ABSTRACT

A wafer processing method including a wafer supporting step of attaching a front side of a dicing tape formed of synthetic resin to a back side of a wafer and supporting a peripheral portion of the dicing tape to an annular frame, a dicing tape heating step of heating a back side of the dicing tape attached to the wafer to soften the dicing tape, thereby flattening the back side of the dicing tape, and a modified layer forming step of applying a laser beam having a transmission wavelength to the wafer through the dicing tape from the back side thereof along the division lines in the condition where the focal point of the laser beam is set inside the wafer, thereby forming a modified layer inside the wafer along each division line.

4 Claims, 7 Drawing Sheets

WAFER PROCESSING METHOD

BACKGROUND OF THE INVENTION

1. Field of the Invention

The present invention relates to a wafer processing method of dividing a wafer into a plurality of devices along a plurality of division lines, the devices being formed on a front side of the wafer and partitioned by the division lines.

2. Description of the Related Art

As well known in the art, in a semiconductor device fabrication process, a functional layer composed of an insulating film and a functional film is formed on a front side of a substrate such as a silicon substrate, and a plurality of semiconductor devices such as ICs and LSIs are formed like a matrix from this functional layer, thus obtaining a semiconductor wafer having the plural semiconductor devices. The plural semiconductor devices are partitioned by a plurality of crossing division lines formed on a front side of the semiconductor wafer. The semiconductor wafer is divided along these division lines to obtain the individual semiconductor devices as chips.

Further, in an optical device fabrication process, an optical device wafer is provided by forming an optical device layer composed of an n-type nitride semiconductor layer and a p-type nitride semiconductor layer on a front side of a sapphire substrate or a silicon carbide substrate. The optical device layer is partitioned by a plurality of crossing division lines to define a plurality of regions where a plurality of optical devices such as light emitting diodes and laser diodes are respectively formed. The optical device wafer is cut along the division lines to thereby divide the regions where the optical devices are formed from each other, thus obtaining the individual optical devices as chips.

As a method of dividing a wafer such as a semiconductor wafer and an optical device wafer along the division lines, there has been tried a laser processing method of applying a pulsed laser beam having a transmission wavelength to the wafer along the division lines in the condition where the focal point of the pulsed laser beam is set inside the wafer in a subject area to be divided. More specifically, this wafer dividing method using laser processing includes the steps of applying a pulsed laser beam having a transmission wavelength to the wafer from one side of the wafer along the division lines in the condition where the focal point of the pulsed laser beam is set inside the wafer to thereby continuously form a modified layer inside the wafer along each division line and next applying an external force to the wafer along each division line where the modified layer is formed to be reduced in strength, thereby dividing the wafer into the individual devices (see Japanese Patent No. 3408805, for example).

In the above method of forming a modified layer inside the wafer along each division line and dividing the wafer along each division line where the modified layer is formed, the modified layer is formed inside the wafer in which the width of each division line is small. Accordingly, it is desirable to apply the laser beam to the wafer from the back side thereof where the devices are not formed. Further, in a pickup step of picking up each device after dividing the wafer along each division line, it is desirable to expose the front side of the wafer where the devices are formed. For these reasons, the wafer is divided in the following manner. First, a laser beam having a transmission wavelength to the wafer is applied to the wafer from the back side thereof along each division line to thereby form a modified layer inside the wafer along each division line. Thereafter, a dicing tape is attached to a back side of the wafer, and a peripheral portion of the dicing tape is supported to an annular frame. Thereafter, an external force is applied to the wafer to thereby divide the wafer into the individual devices (see Japanese Patent Laid-open No. 2006-54246, for example).

However, in the case that the dicing tape is attached to the back side of the wafer after forming the modified layer inside the wafer along each division line, there is a possibility that the wafer may be broken. To cope with this problem, there has been proposed a method such that a front side of a dicing tape is attached to the back side of a wafer and the peripheral portion of the dicing tape is supported to an annular frame prior to forming a modified layer inside the wafer along each division line. Thereafter, a laser beam having a transmission wavelength to the wafer is applied to the wafer through the dicing tape from the back side thereof along each division line in the condition where the focal point of the laser beam is set inside the wafer, thereby forming the modified layer inside the wafer along each division line (see Japanese Patent Laid-open No. 2012-84618, for example).

However, a back side of the dicing tape has fine asperities, causing a problem such that the transmission of the laser beam is hindered and the laser beam cannot be sufficiently focused inside the wafer, so that a desired modified layer cannot be formed. To solve this problem, the technique described in Japanese Patent Laid-open No. 2012-84618 includes a flattening step of applying a liquid resin to the back side of the dicing tape to thereby flatten the back side of the dicing tape. After performing the flattening step, the laser beam having a transmission wavelength to the wafer is applied to the wafer through the dicing tape from the back side thereof along each division line in the condition where the focal point of the laser beam is set inside the wafer, thereby forming the modified layer.

SUMMARY OF THE INVENTION

In the technique described in Japanese Patent Laid-open No. 2012-84618 mentioned above, the liquid resin is applied to the back side of the dicing tape in order to flatten the back side of the dicing tape. However, it is difficult to form the layer of the liquid resin into a flat surface. Further, a laser processing apparatus for forming the modified layer must be equipped with a resin applying apparatus for applying the liquid resin.

It is therefore an object of the present invention to provide a wafer processing method which can easily flatten the back side of the dicing tape and can form a desired modified layer inside the wafer along each division line by applying a laser beam having a transmission wavelength to the wafer through the dicing tape from the back side thereof along each division line in the condition where the focal point of the laser beam is set inside the wafer.

In accordance with an aspect of the present invention, there is provided a wafer processing method of dividing a wafer into a plurality of devices along a plurality of division lines, the devices being formed on the front side of the wafer and partitioned by the division lines, the wafer processing method including a wafer supporting step of attaching the front side of a dicing tape formed of synthetic resin to the back side of the wafer and supporting the peripheral portion of the dicing tape to an annular frame; a dicing tape heating step of heating the back side of the dicing tape attached to the wafer to soften the dicing tape after performing the wafer supporting step, thereby flattening the back side of the dicing tape; and a modified layer forming step of applying a laser beam having a transmission wavelength to the wafer through the dicing tape from the back side thereof along the division lines in the condition where the focal point of the laser beam is set inside the wafer after performing the dicing tape heating step, thereby forming a modified layer inside the wafer along each division line.

Preferably, the dicing tape heating step includes the step of using hot air having a temperature of 100° C. or more to heat the back side of the dicing tape. Preferably, the wafer processing method further includes a wafer dividing step of applying an external force to the wafer after performing the modified layer forming step, thereby dividing the wafer into the individual devices along the division lines where the modified layers are respectively formed.

In the wafer processing method according to the present invention, the wafer supporting step is first performed to attach the front side of the dicing tape formed of synthetic resin to the back side of the wafer, and the peripheral portion of the dicing tape is supported to the annular frame. After performing the wafer supporting step, the dicing tape heating step is performed to heat the back side of the dicing tape attached to the wafer to soften the dicing tape, thereby flattening the back side of the dicing tape. After performing the dicing tape heating step, the modified layer forming step is performed to apply a laser beam having a transmission wavelength to the wafer through the dicing tape from the back side thereof along the division lines in the condition where the focal point of the laser beam is set inside the wafer, thereby forming a modified layer inside the wafer along each division line. Therefore, the back side of the dicing tape is flattened prior to performing the modified layer forming step. Accordingly, the laser beam can be reliably focused at a predetermined position inside the wafer, so that a desired modified layer can be formed inside the wafer along each division line.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
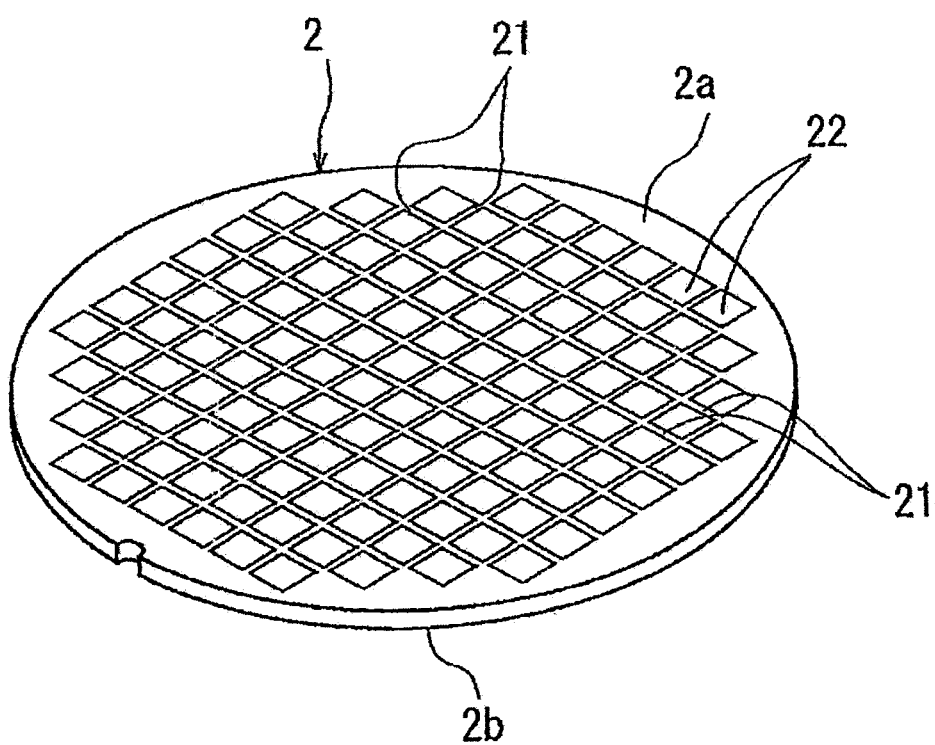
FIG. 1 is a perspective view of a semiconductor wafer as a workpiece to be processed by the wafer processing method according to the present invention.

A wafer processing method according to the present invention will now be described in more detail with reference to the attached drawings. FIG. 1 is a perspective view of a semiconductor wafer 2 as a wafer to be processed by the wafer processing method according to the present invention. The semiconductor wafer 2 shown in FIG. 1 is a silicon wafer having a front side 2a and a back side 2b. A plurality of crossing division lines 21 are formed on the front side 2a of the semiconductor wafer 2, and a plurality of devices 22 such as ICs and LSIs are respectively formed in a plurality of regions partitioned by the plural division lines 21.

Figure 2:
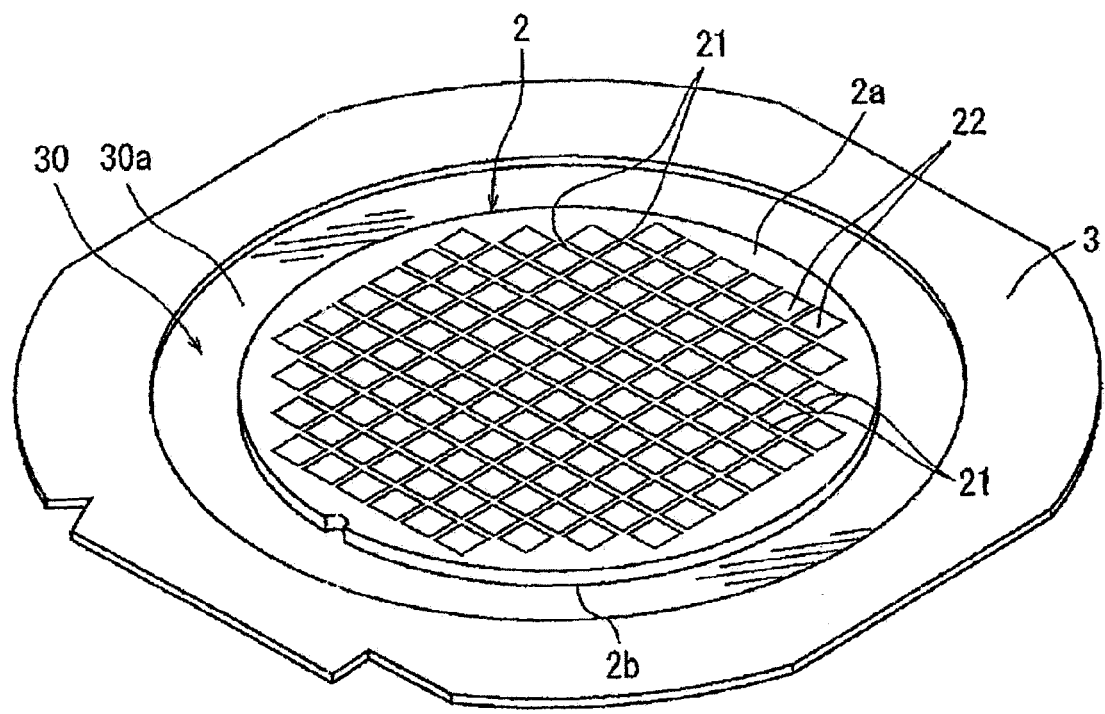
FIG. 2 is a perspective view showing a wafer supporting step.

To divide the semiconductor wafer 2 along the division lines 21, a wafer supporting step is first performed in such a manner that the front side of a dicing tape formed of synthetic resin is attached to the back side 2b of the semiconductor wafer 2 and the peripheral portion of the dicing tape is supported to an annular frame. More specifically, as shown in FIG. 2, a dicing tape 30 having a front side 30a and a back side 30b (see FIG. 3) is supported at its peripheral portion to an annular frame 3 so as to close the inner opening of the annular frame 3, and the back side 2b of the semiconductor wafer 2 is attached to the front side 30a of the dicing tape 30. In this preferred embodiment, the dicing tape 30 is formed from a polyvinyl chloride (PVC) sheet.

Figure 3:
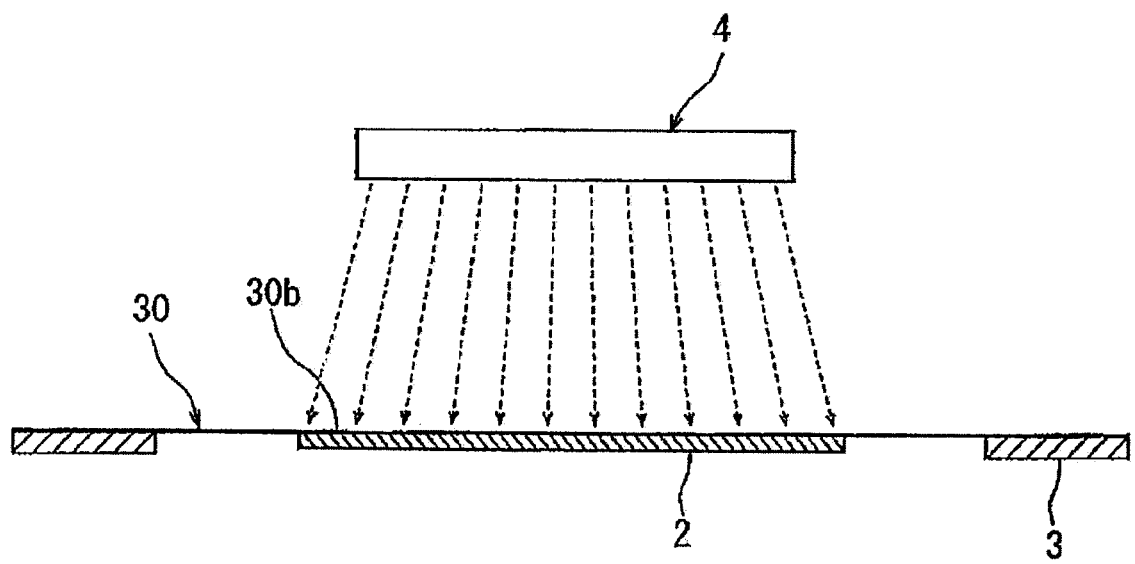
FIG. 3 is a sectional side view for illustrating a dicing tape heating step.

After performing the wafer supporting step mentioned above, a dicing tape heating step is performed in such a manner that the back side 30b of the dicing tape 30 attached to the semiconductor wafer 2 is heated to soften the dicing tape 30 and thereby flatten the back side 30b of the dicing tape 30. As shown in FIG. 3, hot air having a temperature of 250° C., for example, is applied from a heater 4 to the back side 30b of the dicing tape 30 supported to the annular frame 3 in the condition where the back side 2b of the semiconductor wafer 2 is attached to the front side 30a of the dicing tape 30. As a result, the dicing tape 30 is softened and the back side 30b having fine asperities is therefore flattened. Preferably, the temperature of the hot air to be applied to the dicing tape 30 is set to 100° C. or more. In this manner, the back side 30b of the dicing tape 30 is heated in the dicing tape heating step to soften the dicing tape 30, thereby flattening the back side 30b of the dicing tape 30. Accordingly, the back side 30b of the dicing tape 30 can be reliably flattened. Further, the heater 4 is used to apply the hot air to the back side 30b of the dicing tape 30 in the dicing tape heating step, so that the heater 4 is not necessarily provided in a laser processing apparatus to be hereinafter described. That is, the dicing tape heating step can be efficiently performed to many workpieces by using a dedicated heating apparatus.

Figure 4:
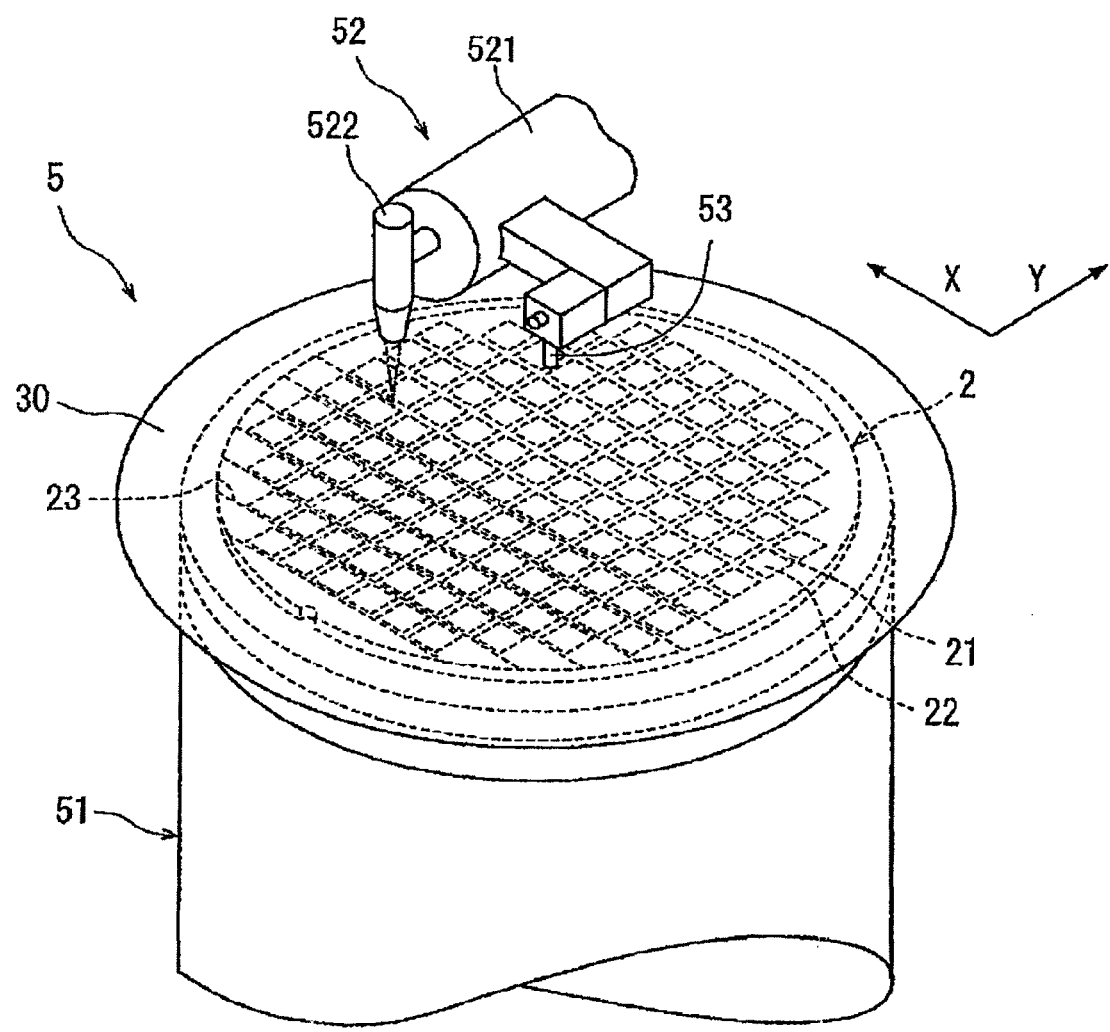
FIG. 4 is a perspective view showing an essential part of a laser processing apparatus for performing a modified layer forming step.

After performing the dicing tape heating step mentioned above, a modified layer forming step is performed in such a manner that a laser beam having a transmission wavelength to the semiconductor wafer 2 is applied through the dicing tape 30 from the back side 30b thereof along the division lines 21 in the condition where the focal point of the laser beam is set inside the semiconductor wafer 2, thereby forming a modified layer inside the semiconductor wafer 2 along each division line 21. This modified layer forming step is performed by using a laser processing apparatus 5 shown in FIG. 4. As shown in FIG. 4, the laser processing apparatus 5 includes a chuck table 51 for holding a workpiece, laser beam applying means 52 for applying a laser beam to the workpiece held on the chuck tale 51, and imaging means 53 for imaging the workpiece held on the chuck table 51. The chuck table 51 has an upper surface as a holding surface for holding the workpiece thereon under suction. The chuck table 51 is movable both in a feeding direction shown by an arrow X in FIG. 4 by feeding means (not shown) and in a indexing direction shown by an arrow Y in FIG. 4 by indexing means (not shown).

The laser beam applying means 52 includes a cylindrical casing 521 extending in a substantially horizontal direction. Although not shown, the casing 521 contains pulsed laser beam oscillating means including a pulsed laser beam oscillator and repetition frequency setting means. The laser beam applying means 52 further includes focusing means 522 mounted on the front end of the casing 521 for focusing a pulsed laser beam oscillated by the pulsed laser beam oscillating means. The laser beam applying means 52 further includes focal position adjusting means (not shown) for adjusting the focal position of the pulsed laser beam to be focused by the focusing means 522.

The imaging means 53 is mounted on a front end portion of the casing 521 constituting the laser beam applying means 52. The imaging means 53 includes an ordinary imaging device (CCD) for imaging the workpiece by using visible light, infrared light applying means for applying infrared light to the workpiece, an optical system for capturing the infrared light applied to the workpiece by the infrared light applying means, and an imaging device (infrared light CCD) for outputting an electrical signal corresponding to the infrared light captured by the optical system. An image signal output from the imaging means 53 is transmitted to control means (not shown).

The modified layer forming step using the laser processing apparatus 5 will now be described with reference to FIGS. 4, 5A, and 5B. In this modified layer forming step, a laser beam having a transmission wavelength to the semiconductor wafer 2 is applied through the dicing tape 30 from the back side 30b thereof along the division lines 21 in the condition where the focal point of the laser beam is set inside the semiconductor wafer 2, thereby forming a modified layer inside the semiconductor wafer 2 along each division line 21.

First, the semiconductor wafer 2 attached to the dicing tape 30 is placed on the chuck table 51 of the laser processing apparatus 5 shown in FIG. 4 in the condition where the semiconductor wafer 2 is in contact with the upper surface of the chuck table 51. Thereafter, suction means (not shown) is operated to hold the semiconductor wafer 2 on the chuck table 51 under suction (wafer holding step). Accordingly, the back side 30b of the dicing tape 30 attached to the semiconductor wafer 2 held on the chuck table 51 is oriented upward. Although the annular frame 3 supporting the dicing tape 30 is not shown in FIG. 4, the annular frame 3 is held by any suitable frame holding means provided on the chuck table 51. Thereafter, the chuck table 51 holding the semiconductor wafer 2 is moved to a position directly below the imaging means 53 by operating the feeding means (not shown).

In the condition where the chuck table 51 is positioned directly below the imaging means 53, an alignment operation is performed by the imaging means 53 and the control means (not shown) to detect a subject area of the semiconductor wafer 2 to be laser-processed. More specifically, the imaging means 53 and the control means perform image processing such as pattern matching for making the alignment of the division lines 21 extending in a first direction on the semiconductor wafer 2 and the focusing means 522 of the laser beam applying means 52 for applying the laser beam to the wafer 2 along the division lines 21, thus performing the alignment of a laser beam applying position (alignment step). Similarly, this alignment step is performed for the other division lines 21 extending in a second direction perpendicular to the first direction on the semiconductor wafer 2. Although the front side 2a of the semiconductor wafer 2 on which the division lines 21 are formed is oriented downward, the division lines 21 can be imaged through the dicing tape 30 and the semiconductor wafer 2 from the back side 2b thereof because the imaging means 53 includes the infrared light applying means for applying infrared light to the wafer 2, the optical system for capturing the infrared light applied to the wafer 2, and the imaging device (infrared light CCD) for outputting an electrical signal corresponding to the infrared light captured by the optical system as described above.

Figure 5A:
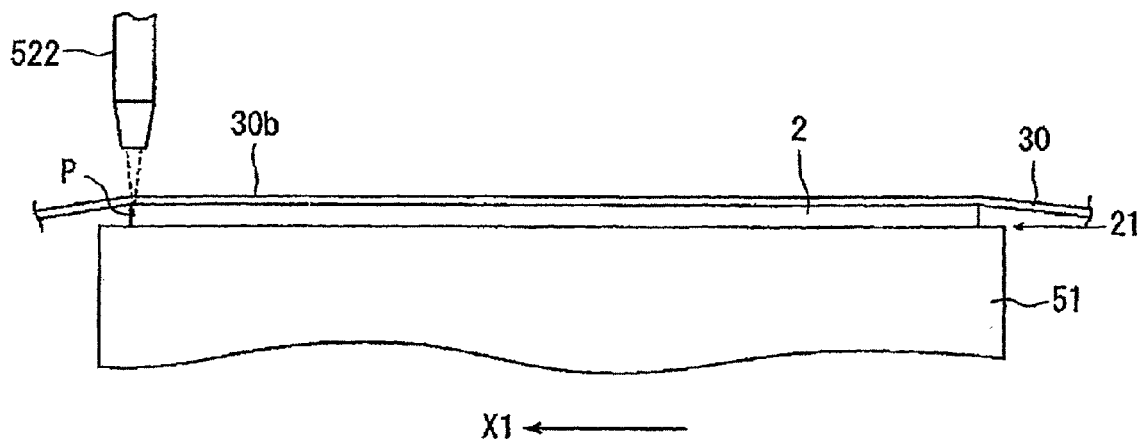
FIGS. 5A and 5B are sectional side views for illustrating the modified layer forming step.
Figure 5B:
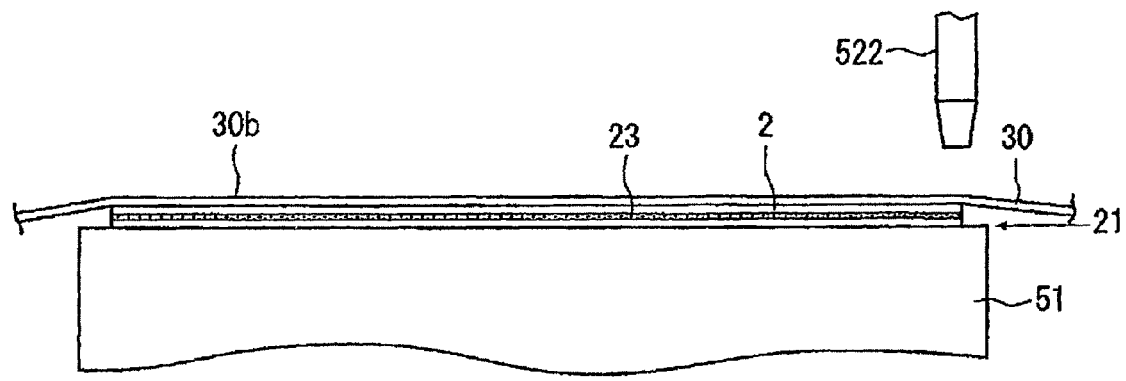

After performing the alignment step mentioned above for all of the division lines 21, the chuck table 51 is moved to a laser beam applying area where the focusing means 522 of the laser beam applying means 52 is located as shown in FIG. 5A, thereby positioning one end (left end as viewed in FIG. 5A) of a predetermined one of the division lines 21 extending in the first direction directly below the focusing means 522. Further, a focal point P of a pulsed laser beam to be applied from the focusing means 522 is set at an intermediate position in the direction along the thickness of the semiconductor wafer 2. Thereafter, the pulsed laser beam having a transmission wavelength to a silicon wafer is applied from the focusing means 522 to the semiconductor wafer 2, and the chuck table 51 is moved in the direction shown by an arrow X1 in FIG. 5A at a predetermined feed speed (modified layer forming step). When the other end (right end as viewed in FIG. 5B) of the predetermined division line 21 reaches the position directly below the focusing means 522 as shown in FIG. 5B, the application of the pulsed laser beam is stopped and the movement of the chuck table 51 is also stopped. As a result, a modified layer 23 is formed inside the semiconductor wafer 2 along the predetermined division line 21 as shown in FIG. 5B.

For example, the modified layer forming step mentioned above is performed under the following processing conditions.

Light source: YAG pulsed laser
Wavelength: 1064 nm
Repetition frequency: 80 kHz
Average power: 0.2 W
Work feed speed: 180 mm/s After performing the modified layer forming step along the predetermined division line 21 as mentioned above, the chuck table 51 is moved in the indexing direction shown by the arrow Y in FIG. 4 by the pitch of the division lines 21 formed on the semiconductor wafer 2 (indexing step), and the modified layer forming step is similarly performed along the next division line 21 extending in the first direction. In this manner, the modified layer forming step is performed along all of the division lines 21 extending in the first direction. Thereafter, the chuck table 51 is rotated 90 degrees to similarly perform the modified layer forming step along all of the other division lines 21 extending in the second direction perpendicular to the first direction.

As described above, the laser beam having a transmission wavelength to the wafer is applied through the dicing tape 30 from the back side 30b thereof along the division lines 21 in the condition where the focal point of the laser beam is set inside the semiconductor wafer 2 in the modified layer forming step. In the dicing tape heating step to be performed prior to the modified layer forming step, the back side 30b of the dicing tape 30 is flattened. Accordingly, the laser beam can be reliably focused at a predetermined position inside the semiconductor wafer 2, so that the desired modified layer 23 can be formed inside the semiconductor wafer 2 along each division line 21.

Figure 6:
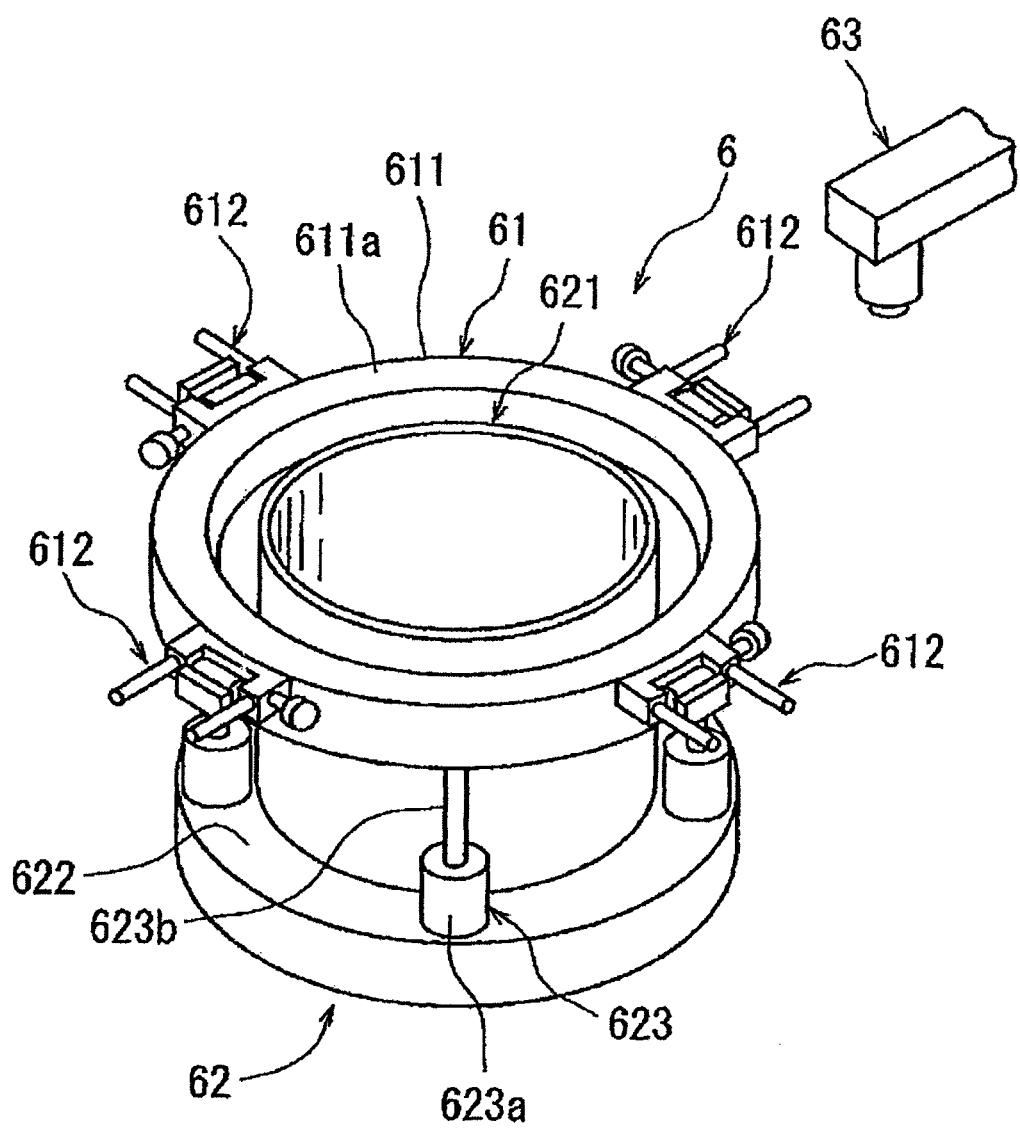
FIG. 6 is a perspective view of a dividing apparatus for performing a wafer dividing step.

After performing the modified layer forming step mentioned above, a wafer dividing step is performed in such a manner that an external force is applied to the semiconductor wafer 2 to divide the semiconductor wafer 2 along the division lines 21 where the modified layers 23 are respectively formed, thereby obtaining the individual devices 22. This wafer dividing step is performed by using a dividing apparatus 6 shown in FIG. 6. The dividing apparatus 6 shown in FIG. 6 includes frame holding means 61 for holding the annular frame 3, tape expanding means 62 for expanding the dicing tape 30 supported to the annular frame 3 held by the frame holding means 61, and a pickup collet 63. The frame holding means 61 includes an annular frame holding member 611 and a plurality of clamps 612 as fixing means provided on the outer circumference of the frame holding member 611. The upper surface of the frame holding member 611 functions as a mounting surface 611a for mounting the annular frame 3 thereon. The annular frame 3 mounted on the mounting surface 611a is fixed to the frame holding member 611 by the clamps 612. The frame holding means 61 is supported by the tape expanding means 62 so as to be vertically movable.

Figure 7A:
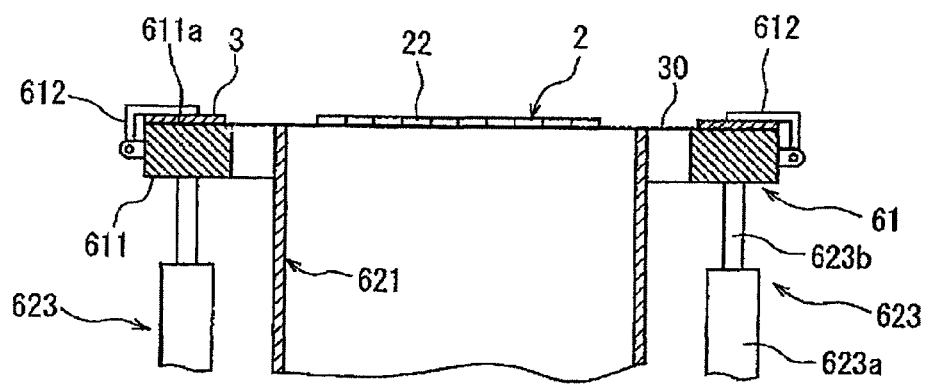
FIGS. 7A to 7C are sectional side views for illustrating the wafer dividing step.
Figure 7B:
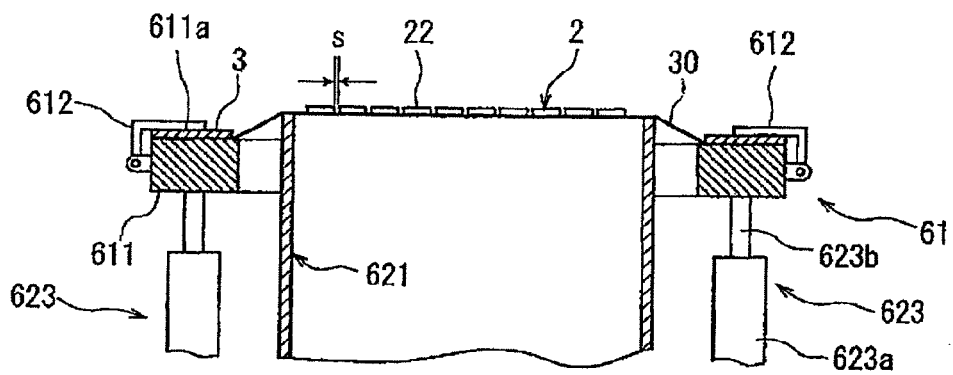

The tape expanding means 62 includes an expanding drum 621 provided inside of the annular frame holding member 611. The expanding drum 621 has an outer diameter smaller than the inner diameter of the annular frame 3 and an inner diameter larger than the outer diameter of the semiconductor wafer 2 attached to the dicing tape 30 supported to the annular frame 3. The expanding drum 621 has a supporting flange 622 at the lower end of the expanding drum 621. The tape expanding means 62 further includes supporting means 623 for vertically movably supporting the annular frame holding member 611. The supporting means 623 is composed of a plurality of air cylinders 623a provided on the supporting flange 622. Each air cylinder 623a is provided with a piston rod 623b connected to the lower surface of the annular frame holding member 611. The supporting means 623 composed of these plural air cylinders 623a functions to vertically move the annular frame holding member 611 so as to selectively take a reference position where the mounting surface 611a is substantially equal in height to the upper end of the expanding drum 621 as shown in FIG. 7A and an expansion position where the mounting surface 611a is lower in height than the upper end of the expanding drum 621 by a predetermined amount as shown in FIG. 7B.

The wafer dividing step using the dividing apparatus 6 will now be described with reference to FIGS. 7A to 7C. As shown in FIG. 7A, the annular frame 3 supporting the semiconductor wafer 2 through the dicing tape 30 is mounted on the mounting surface 611a of the frame holding member 611 of the frame holding means 61 in the condition where the semiconductor wafer 2 is oriented upward. Thereafter, the annular frame 3 is fixed to the frame holding member 611 by the clamps 612 (frame holding step). At this time, the frame holding member 611 is set at the reference position shown in FIG. 7A. Thereafter, the air cylinders 623a as the supporting means 623 of the tape expanding means 62 are operated to lower the frame holding member 611 to the expansion position shown in FIG. 7B. Accordingly, the annular frame 3 fixed to the mounting surface 611a of the frame holding member 611 is also lowered, so that the dicing tape 30 supported to the annular frame 3 comes into abutment against the upper end of the expanding drum 621 and is expanded as shown in FIG. 7B (tape expanding step). As a result, a tensile force radially acts on the semiconductor wafer 2 attached to the dicing tape 30. Accordingly, the semiconductor wafer 2 is divided into the individual devices 22 along the division lines 21 where the modified layers 23 are respectively formed to be reduced in strength. At the same time, a spacing S is formed between any adjacent ones of the individual devices 22.

Figure 7C:
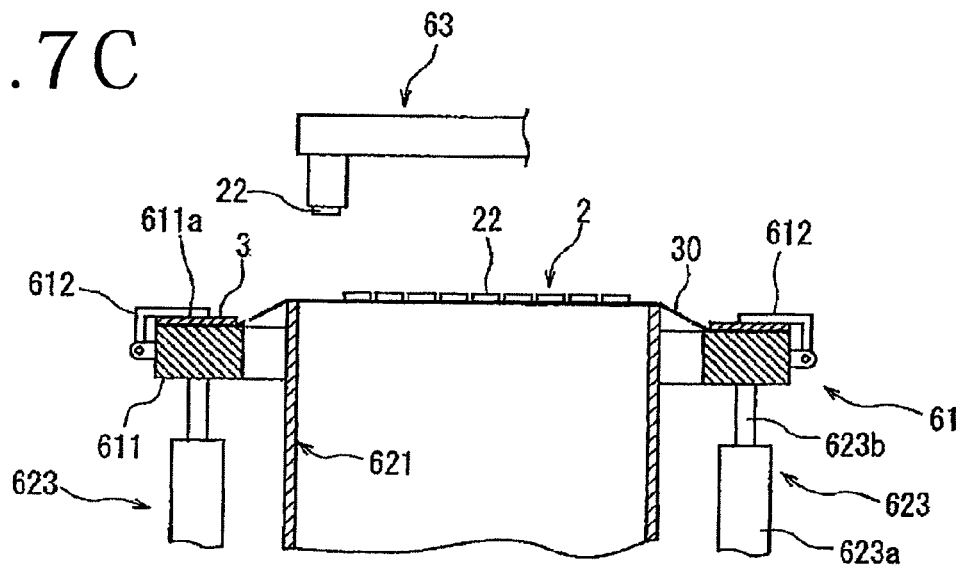

Thereafter, the pickup collet 63 is operated to hold each device 22 under suction and peel it from the dicing tape 30, thereby individually picking up the devices 22 as shown in FIG. 7C (pickup step). Each device 22 is next transferred to a tray (not shown) or any apparatus for performing a die bonding step. In the pickup step, each device 22 can be easily picked up without the contact with its adjacent device 22 because the spacing S is formed between any adjacent ones of the individual devices 22 attached to the dicing tape 30.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer processing method of dividing a wafer into a plurality of devices along a plurality of division lines, said devices being formed on a front side of said wafer and partitioned by said division lines, said wafer processing method comprising:
    a wafer supporting step of attaching a front side of a dicing tape formed of synthetic resin to a back side of said wafer and supporting a peripheral portion of said dicing tape to an annular frame;
    a dicing tape heating step of heating a back side of said dicing tape attached to said wafer to soften said dicing tape after performing said wafer supporting step, thereby flattening the back side of said dicing tape; and
    a modified layer forming step of applying a laser beam having a transmission wavelength to said wafer through said dicing tape from the back side thereof along said division lines in a condition where the focal point of said laser beam is set inside said wafer, thereby forming a modified layer inside said wafer along each division line, wherein said modified layer forming step is performed after performing said dicing tape heating step.

2. A wafer processing method of dividing a wafer into a plurality of devices along a plurality of division lines, said devices being formed on a front side of said wafer and partitioned by said division lines, said wafer processing method comprising:
    a wafer supporting step of attaching a front side of a dicing tape formed of synthetic resin to a back side of said wafer and supporting a peripheral portion of said dicing tape to an annular frame;
    a dicing tape heating step of heating a back side of said dicing tape attached to said wafer to soften said dicing tape after performing said wafer supporting step, thereby flattening the back side of said dicing tape; and
    a modified layer forming step of applying a laser beam having a transmission wavelength to said wafer through said dicing tape from the back side thereof along said division lines in a condition where the focal point of said laser beam is set inside said wafer after performing said dicing tape heating step, thereby forming a modified layer inside said wafer along each division line,
    wherein said dicing tape heating step comprises the step of using hot air having a temperature of 100° C. or more to heat the back side of said dicing tape.

3. The wafer processing method according to claim 1, further comprising:
    a wafer dividing step of applying an external force to said wafer after performing said modified layer forming step, thereby dividing said wafer into said individual devices along said division lines where said modified layers are respectively formed.

4. The wafer processing method according to claim 2, further comprising:
    a wafer dividing step of applying an external force to said wafer after performing said modified layer forming step, thereby dividing said wafer into said individual devices along said division lines where said modified layers are respectively formed.

* * * * *